United States Patent [19]
Rosner et al.

[11] Patent Number: 5,331,370
[45] Date of Patent: Jul. 19, 1994

[54] METHOD AND APPARATUS FOR DETERMINING A FEATURE-FORMING VARIANT OF A LITHOGRAPHIC SYSTEM

[75] Inventors: S. Jeffrey Rosner, Palo Alto; Nader Shamma, Los Altos; Frederik Sporon-Fiedler, San Mateo, all of Calif.

[73] Assignee: Hewlett-Packard Company, Palo Alto, Calif.

[21] Appl. No.: 56,099

[22] Filed: May 3, 1993

[51] Int. Cl.⁵ .............................................. G03B 27/42
[52] U.S. Cl. ...................................... 355/53; 359/564
[58] Field of Search .................. 355/53; 356/401, 356, 356/354, 71; 359/559, 564

[56] References Cited

U.S. PATENT DOCUMENTS

| | | | |
|---|---|---|---|
| 3,879,131 | 4/1975 | Cuthbert et al. | 356/106 R |
| 3,957,376 | 5/1976 | Charsky et al. | 356/106 R |
| 3,972,616 | 8/1976 | Minami et al. | 356/71 |
| 4,873,653 | 10/1989 | Grosskopf | 364/525 |
| 4,890,239 | 12/1989 | Ausschnitt et al. | 364/491 |
| 4,927,220 | 5/1990 | Hesselink et al. | 350/3.64 |
| 4,929,951 | 5/1990 | Small | 342/179 |
| 4,962,382 | 10/1990 | Lee | 342/372 |

*Primary Examiner*—Richard A. Wintercorn

[57] ABSTRACT

A method of determining a feature-forming variant, such as focus or exposure, for a lithographic system or the like includes Fourier processing that extracts a figure of merit. In a preferred embodiment, the lithographic system fabricates a series of formations of a single pattern. An optical image of each exposure is formed. A Fourier power spectrum is determined for each optical image. An angular power function is extracted from each power spectrum by quantifying optical power along lines originating at various angles from an origin of the power spectrum. With regard to axes of maximum power, the distribution of on-axes and off-axes power is quantified for each angular power function. An optimum for the lithographic system is determined based upon the data extracted from the angular power functions. Preferably, the extraction of an angular power function from the associated Fourier power spectrum is an averaging of the optical power along selected portions of the lines originating from the origin, thereby improving the signal-to-noise ratio.

20 Claims, 9 Drawing Sheets

METHOD AND APPARATUS FOR DETERMINING A FEATURE-FORMING VARIANT OF A LITHOGRAPHIC SYSTEM

TECHNICAL FIELD

The present invention relates generally to methods and apparatus for determining operation variants of an optical system and more particularly to focusing a lithographic system.

BACKGROUND ART

In the development and manufacture of integrated circuits, the capabilities of Very Large Scale Integrated (VLSI) and Ultra-Large Scale Integrated (ULSI) circuits are driven by different fabrication technologies, but optical lithography is typically recognized as the most critical. Technology generations of integrated circuits are measured in terms of lithographic minimum feature sizes, e.g., sub-micron linewidths.

The ever-increasing demand for smaller circuit features and higher packing densities has mainly been satisfied by increasing the numerical aperture of a lens system in a microlithographic tool. However, the performance of most lithographic lenses is diffraction limited. The three variables that determine this limit are (1) the lens numerical aperture, (2) the wavelength of the exposing radiation, and (3) the coherence of the exposing radiation. Rayleigh criteria may be used as an approximation for determining the minimum resolution and the total focus depth of a diffraction-limited system. Regarding minimum resolution, the equation is as follows:

$$\text{Minimum Resolution} = k1 \text{ (exposing wavelength/NA)}$$

where NA is the numerical aperture and k1 is a scaling factor which depends on the lens aberration and a number of other factors. Generally, it is assumed that $k1 = 0.8$ for the present generation of lithographic tools. The depth of focus for the minimum feature resolved according to the equation above is determined as follows:

$$\text{Depth of Focus} = k2 \text{ (exposing wavelength/(NA)}^2)$$

where k2 is a scaling factor that is dependent upon lens aberrations and processing factors. A nominal value of 0.8 is assumed for k2.

From the equations above, it can be seen that an increase in the numerical aperture of the projection optics achieves superior resolutions, but at the expense of the depth of focus. The range of acceptable focus is further reduced by such factors as the existing topography of the substrate, any non-flatness of the substrate, the precision of the lithographic tool's auto focus system, and the error associated with the process of determining the optimal focus.

It has recently been found that the optimal focus, as determined by the lithographic tool's auto focus system, is a function of the type of film on the surface of the substrate. For instance, as determined by the tool, there may be a 0.4 μm offset of the best focus plane for a poly gate level as compared to a contact mask. It has also been determined that the optimal focus is a function of the existing topography on the substrate. This has been observed as a 0.2 μm shift in the best focus plane between the poly gate level for a memory circuit and the same level for a CPU chip. These results indicate that accurate determination of optimal focus is a critical factor in achieving the maximum depth of focus that is available from a particular projection lens.

As defined herein, a "lithographic system" is defined as including components (1) for the transfer of an image through a projection system, (2) for the interaction of projected flux with a resist system, and (3) for the development of the image into the resist.

There are three conventional methods of determining how accurately a desired image is being reproduced upon passage through a lithographic system. The first method is described in U.S. Pat. No. 4,890,239 to Ausschnitt et al. This method relies on the measurement of the linewidth of a lithographic feature over a range of focus positions. A graph of linewidth versus focus is formed for the series of focal settings. The optimal focus is extracted by selecting the value at which the linewidth is least sensitive to exposure, i.e., where the curves of linewidth versus focus are most tightly bunched together. While this method has been acceptable in the past, it has severe shortcomings that are a direct result of the above-described trend of increasing the numerical aperture. For tools associated with a very high numerical aperture, curves of linewidth versus focus have become asymmetrical. Thus, deducing the optimal focus using this method has become more difficult.

A second method of choosing optimal focus is based on obtaining cross sections of a set of parallel lines or contacts in an SEM (Scanning Electronic Microscope) over a range of focus positions. Sidewall angle is then plotted as a function of focus, with sidewall angle being defined as the angle of a wall of photoresist relative to a wafer surface. Optimal focus is determined by selecting the maximum of the plot. Unlike the method described in Ausschnitt, this method works well even for cases in which curves are asymmetrical. However, obtaining cross sections of the lines or contacts requires destructive and dirty cleaving of a sample and is labor intensive.

A third method used in identifying an optimal focus is one which requires an operator to visually identify the best focus in an electron or optical microscope by inspecting the "quality" of the image as a function of focus. This method is operator-dependent and exhibits large operator-to-operator variations.

An object of the invention is to provide a method and apparatus for determining optimal settings for operation variants of a feature-forming system.

SUMMARY OF THE INVENTION

The above object has been met by a method and system which provide a quantitative assessment of lithographically printed patterns of one or more features in a determination of an optimum for focus, exposure or other feature-forming variant. An image of the printed pattern is formed and then transformed from an intensity-variable spatial pattern to a two-dimensional power spectrum by means of a Fourier transform. The resulting transformed optical power spectrum of the image includes at least one axis of maximum optical power. The optical power along one or more of the axes is compared to optical power that is represented between the axes of maximum power, thereby quantitatively assessing the degree to which the feature or features of a pattern have been "rounded." A figure of merit for focus, exposure or other feature-forming variant may be selected in response to the comparison of on-axis power to off-axis power. The "image-forming variant" may even be a choice among systems for creating the printed pattern, so that "setting" the image-forming variant may be a step of selecting one lithographic tool over another.

Typical applications of the invention are quantitatively determining optimums for the fabrication of integrated circuit chips and printed circuit boards. Integrated circuits have traditionally consisted of features having edges that are ideally at right angles to each other. This is referred to as a "Manhattan layout," wherein intersecting edges are designed to meet at sharp 90° corners. For a Manhattan layout, a transformed optical power spectrum will have two orthogonal axes of maximum optical power. Non-ideal conditions and settings during fabrication of the designed layout will create rounded corners at the intersection of edges. The invention provides a quantitative assessment of the rounding in order to determine a figure of merit. "Non-Manhattan layouts" are not limited to 90° corners. Where designed geometries are not limited to orthogonal line sets, the invention may be used if the features of importance belong to a reasonably small set of rotational angles, so that maximum power axes and intermediate angles may be defined in determining on-axis power and off-axis power. For example, non-Manhattan layouts in which designed edges intersect at corners that form only 45° angles and 90° angles will have four axes of maximum power at 45° to each other.

In a preferred embodiment, a series of pattern formations is fabricated in a resist. Each formation within the series is fabricated in a manner to obtain the same pattern of one or more features, but at a different setting of a particular feature-forming variant, such as focus or exposure intensity or the wavelength of the exposing light. For each formation, an image is then digitally or photographically recorded. The series may also consist of identical patterns in which the feature-forming variant that is varied is unrelated to exposure, e.g. resist thickness, the type of resist or the parameters of a resist bake.

While not critical, processing the sampled images may begin with enhancing the fine structure that is of interest, while suppressing noise and any unimportant features of the images. Enhancing the structure of interest may be carried out by a simple smoothing, differentiation, the application of an edge-enhancing filter or other algorithmic enhancements common to existing image processing practice.

For each image, a two-dimensional discrete Fourier transform is calculated. The Fourier transform is then squared to obtain a two-dimensional power spectrum.

optionally, each Fourier power spectrum may be displayed as an image oriented in registration with the real space image from which the power spectrum was determined. Within the Fourier power spectrum, distance from an origin is linearly related to spatial frequency. The display is not critical, since computer programming is known for carrying out quantitative assessments within critical dimension (CD) measurement tools.

The quantitative assessment is achieved by first extracting an angular power function for each power spectrum. The average optical power along the horizontal line through the origin of the power spectrum is calculated. Optionally, a minimum radius and a maximum radius along the line through the origin may be defined in order to limit the calculation of average power to a portion of the line that is least likely to have significant contributions from sampling noise and other high frequency effects, as well as absolute contrast levels in the image. The calculation of average power is repeated for all lines at angles from −180° to +180° If the minimum and/or maximum radii were used for the horizontal line, they should be used for all other lines. The result is an angular power function that represents the strength of the lithographically printed features in various directions. A characteristic of the Fourier power spectrum is that all features reflect exactly through the origin, so that the optical value of the angular power function from +180° to −180° is exactly equivalent. Differences in the amount of information between axes of maximum power in the Fourier power spectrum calculated for an image having rounded corners are significantly more apparent in the extracted angular power function.

A figure of merit is then extracted from each angular power function. The angle of maximum power, i.e. the maximum value of the angular power function, is defined as the zero angle. This ensures that an axis of maximum power is used in determining the difference between on-axis power and off-axis power. While not critical, the preferred approach defines a figure of merit for fabricating a Manhattan layout as the difference between (1) the product of the power value at the zero angle times the value at 90° from the zero angle and (2) the product of the power values at +45° and −45° from the zero angle. The figures of merit extracted from the angular power functions of the various power spectra in a series are then used to select the optimum of the feature-forming variant of interest. The method may also be used in determining settings for non-Manhattan layouts by applying a similar approach of finding a difference between on-axis power and off-axis power.

The calculations for providing the Fourier power spectrum may be eliminated by use of a conventional lens to create the spectrum at the back focal plane of the lens. If the spectrum is obtained optically, the angular power function can be obtained electro-mechanically. A rotating slot shutter may be positioned in the back focal plane of the lens, with the light that passes through the slot shutter being collected and quantified to ascertain the angular power function.

While the method has been described as being used with lithographic systems, it may be used in other applications. Feature-forming variants in the fabrication of integrated circuits and printed circuit boards may be determined. Uses include, but are not limited to, the determination of optimal focus, exposure, resist materials, etchants, and parameters for pre-exposure and post-exposure bakes. Moreover, as previous noted, the method may be used to select among systems for forming the feature or features.

An advantage of the present invention is that a quantitative assessment is provided, allowing a determination of best focus that is not operator dependent. Moreover, the method may be carried out in a short period of time.

BEST MODE FOR CARRYING OUT THE INVENTION

Figure 1:
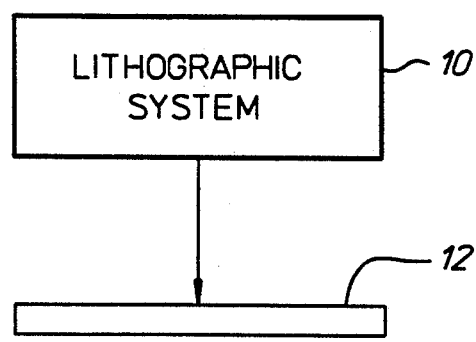
FIG. 1 is a schematic representation of a lithographic system for forming a pattern on a semiconductor wafer.

With reference to FIG. 1, a lithographic system 10 for use in fabricating integrated circuits on a semi-conductor wafer 12 is shown. Feature-forming variants for transferring a desired image and for fabricating the image into a layer can be optimized using the method to be described below. The lithographic system is defined herein as including the transfer of the desired image through a projection system, the interaction of projected flux with the resist, and the development of the desired image into the resist. Thus, optimal focus, optimal exposure and other optical properties may be quantified. Moreover, materials for fabricating the pattern and process parameters can be selected using the invention.

For the purpose of clarity, the method will be described primarily with reference to determining a figure of merit for a focus setting. A first step of the invention is to fabricate a series of lithographic pattern formations in a resist layer on the semiconductor wafer 12. For example, a through focus series may include settings ranging from $-1.4$ $\mu m$ to $+1.4$ $\mu m$ or an exposure series may include settings within the range of x joules to y joules.

Figure 2A:
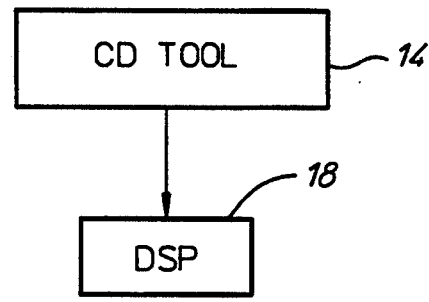
FIGS. 2A and 2B are schematic representations of apparatus for determining an optimum of a feature-forming variant for the lithographic system of FIG. 1 in accordance with the present invention.

Images of the exposed resist layer on the semiconductor wafer 12 are then recorded digitally or photolithographically. In a preferred embodiment, the images are recorded digitally using a commercially available critical dimension (CD) measurement tool, such as the Hitachi S6000. The CD tool 14 is shown in FIG. 2A. A Scanning Electron Microscope (SEM) steps from die to die to automatically acquire a digital image of a pattern consisting of one or more features.

In the preferred embodiment of FIG. 2A, the CD tool that digitally records each image is connected directly to a Digital Signal Processor (DSP) 18. The DSP is an image processing system that is commercially available. For example, a Hewlett-Packard Vectra 486/25 may be used with a Synoptics Synergy framestore plug-in card. The software was developed under SEMPER 6+, an operating system available from Synoptics, but other software may be substituted. The resulting system allows development of programs using image-specific commands and simplifies the development of routines such as the one described below.

Figure 2B:
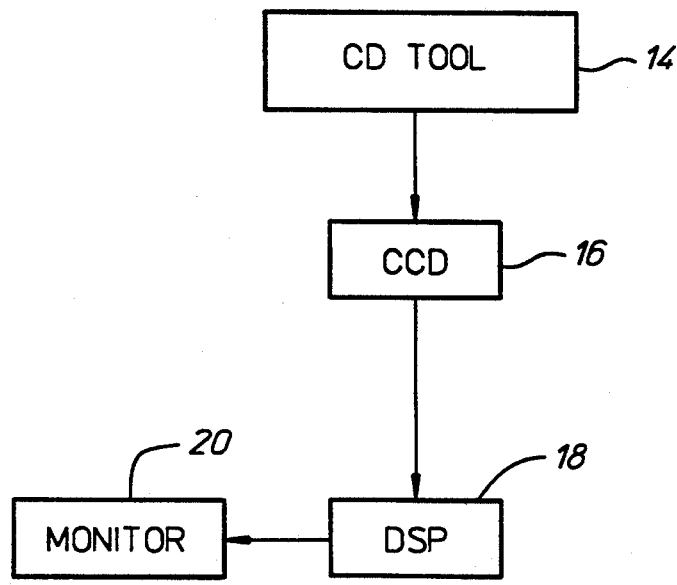

In an alternate embodiment, the images are photographically recorded on film. In FIG. 2B, a CCD camera 16 may be mounted on a stand to scan recorded images into the DSP 18. A dedicated black-and-white video monitor 20 may optionally be used.

For each of the sampled images of the through focus series, the DSP 18 may provide simple smoothing, differentiation, or an application of an edge-enhancing filter or other known image enhancement algorithm to enhance the fine structure unique to the resist pattern of interest, while suppressing noise and features that are not of interest. A Fourier power spectrum is then developed for each of the images. This is accomplished by calculating a two-dimensional discrete Fourier transform and then squaring the transform.

Figure 3:
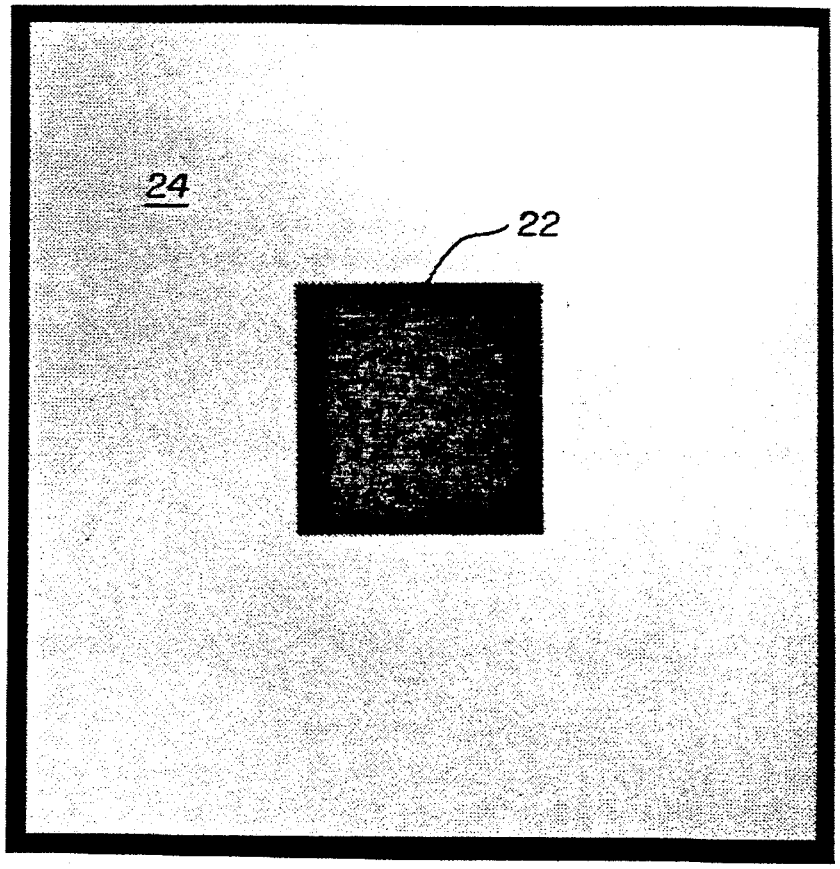
FIG. 3 is a top view of an ideal feature printed by the lithographic system of Fig. 1.
Figure 4:
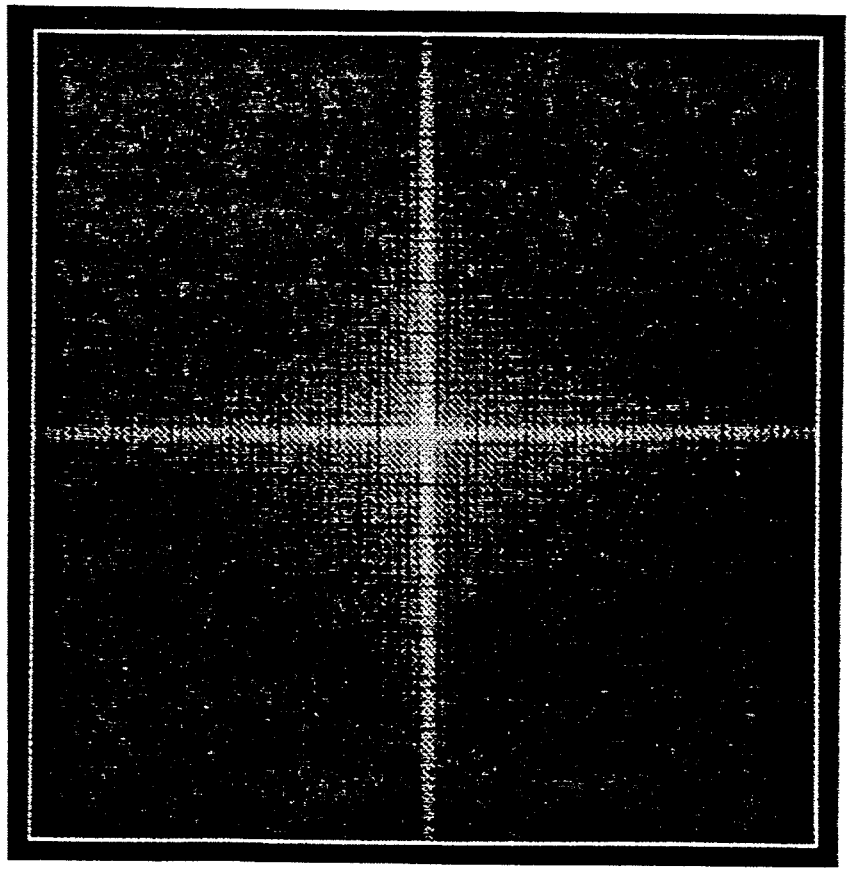
FIG. 4 is a Fourier power spectrum generated for the image of FIG. 3.

While the processing is typically performed entirely electronically, the Fourier power spectrum may be displayed on the monitor 20. The display will be an image oriented in registration with the real space image from which the power spectrum was determined. FIG. 3 is a sampled image of a square feature 22 formed in a resist layer 24. FIG. 4 illustrates the associated Fourier power spectrum of the image of FIG. 3.

As is typical with photolithographically printed patterns, the feature 22 of FIG. 3 consists of orthogonal line sets. This is referred to as a Manhattan lay-out. Here, the line sets are in horizontal and vertical directions, but may be at other angles as well. In a manner consistent with the information in the image in FIG. 3, the Fourier power spectrum of FIG. 4 contains two orthogonal sets of information. That is, the optical power exists along only two orthogonal axes. The periodicity of the information found on these axes contains the dimensions of the square feature and its associated harmonics. The pattern of FIG. 3 is a simple one. An integrated circuit will have a greater number of features in the pattern. Regardless of the number of features, a Manhattan layout will provide a power spectrum having the two orthogonal axes of maximum power. A non-Manhattan layout will result in additional axes of maximum power, but the method may be used with such layouts if the additional axes are reasonable in number.

Figure 5:
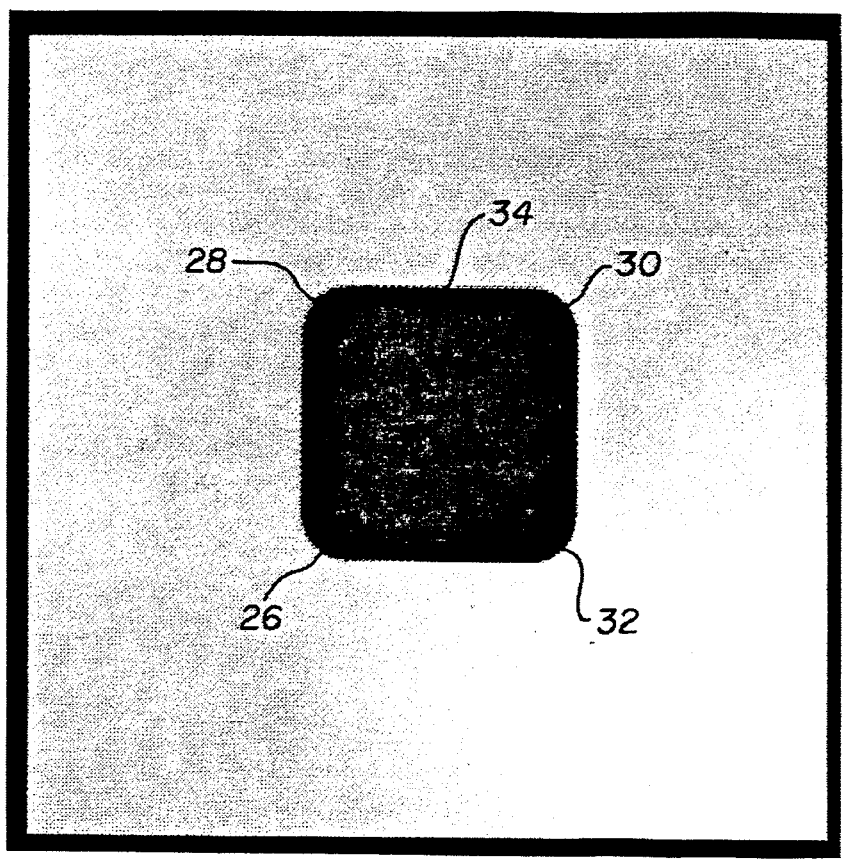
FIG. 5 is a top view of the feature of FIG. 3, wherein corners have been rounded as a result of a non-ideal setting of the lithographic system of FIG. 1.

In FIG. 5, a non-optimal setting of the lithographic system described above has caused the corners 26, 28, 30 and 32 of the feature 34 to be rounded. The rounded corners are lines that are not orthogonal, so that the associated Fourier power spectrum in FIG. 6 includes information that is off of the orthogonal axes of the spectrum. That is, there is an increase in the power content at angles intermediate to the orthogonal axes, as compared to the spectrum of FIG. 4. The present invention provides a quantitative assessment of the degree to which features of a desired image have been rounded. The quantitative assessment is then used to select process settings and parameters.

Figure 6:
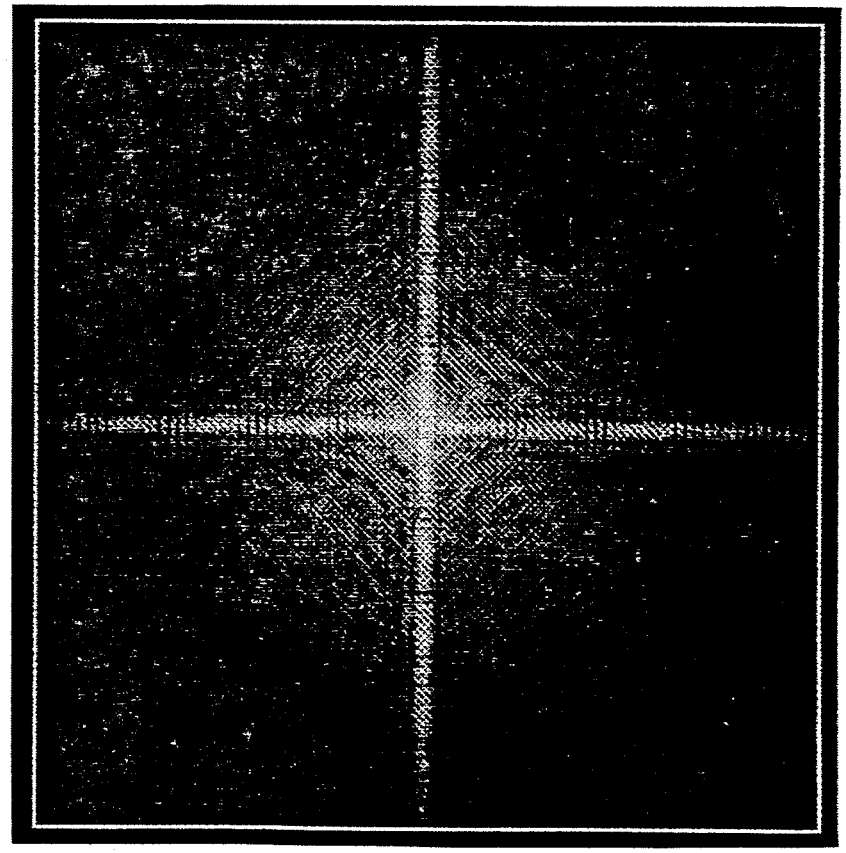
FIG. 6 is a Fourier power spectrum generated for the image of FIG. 5.

The quantitative assessment described herein is an extraction of the relative amounts of information from the different angular regions of the power spectrum, so as to obtain a figure of merit for the passage of an ideal image through the lithographic system. From each power spectrum, an angular power function is extracted. In FIGS. 4 and 6, a zero degree point is defined as a horizontal line originating at the intersection of the orthogonal axes and extending in a positive direction, i.e. extending to the right. The average power along this horizontal line is calculated. The calculation is repeated for lines at all angles from $-180°$ to $+180°$, so as to create an angular power function that represents the strength of the square feature in various directions.

While not critical, a maximum radius may be defined from the origin, i.e. the intersection of the orthogonal axes of maximum power. By limiting the calculation of average power to the distance within the maximum radius, the contribution from sampling noise and other high frequency effects may be reduced. A minimum radius may also be defined in order to reduce the contribution from absolute contrast levels in the image.

Figure 7:
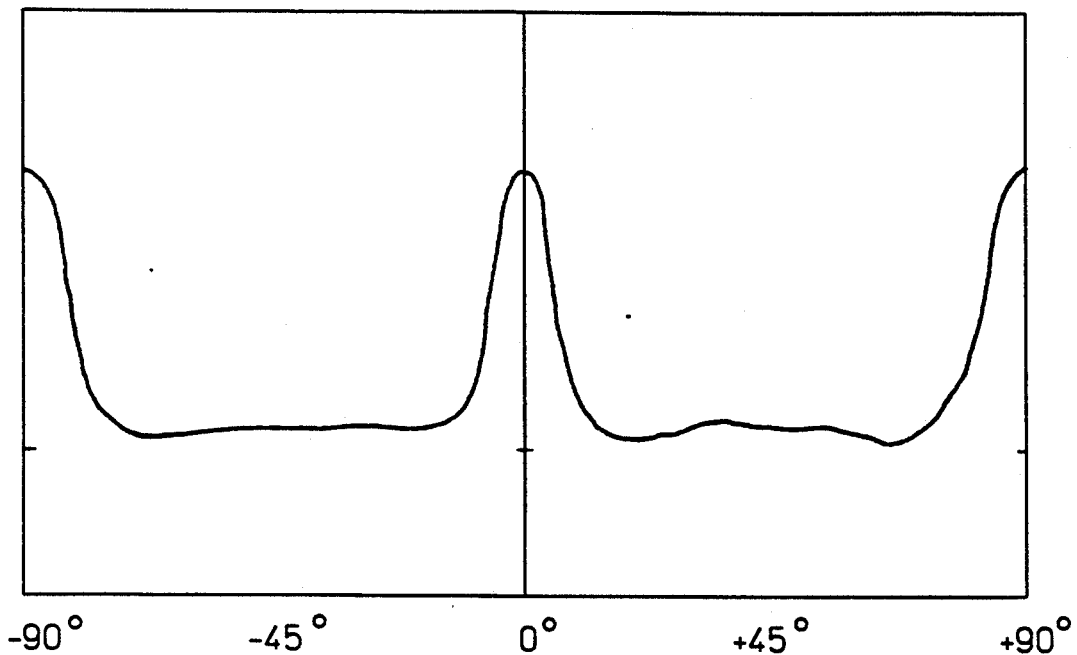
FIG. 7 is a graph of an angular power function extracted from the power spectrum of FIG. 4.

Within a Fourier power spectrum, all features reflect exactly through the origin. Consequently, the calculated average power of the angular power function from $+180°$ to $-180°$ is a mirror image. One-half of the angular power function for the spectrum of FIG. 4 is shown in FIG. 7, while the angular power function for the power spectrum of FIG. 6 is partially represented in FIG. 8. As can be seen, the differences in the amount of non-orthogonal information in the Fourier power spectrum determined from the rounded image is significantly more apparent in the angular power function.

While the angular power function has been described as an averaging of optical power along lines at angles to each other, an averaging is not critical. Other means of calculating an angular power function may be employed. For example, an addition process may be employed.

The figure of merit is extracted from the angular power function. Firstly, the angle of maximum power is determined. This step is no more than a determination of the maximum value along the angular power function. This is defined as the zero point of angular value. The determination of the zero point of angular value is important in those cases in which the orthogonal lines of the lithographically printed features are at an angle to the horizontal and vertical in recording and scanning the sampled image. Because the square feature of FIGS. 3 and 5 has horizontal and vertical line sets, the zero point of angular value in FIGS. 7 and 8 is at the origin.

Figure 8:
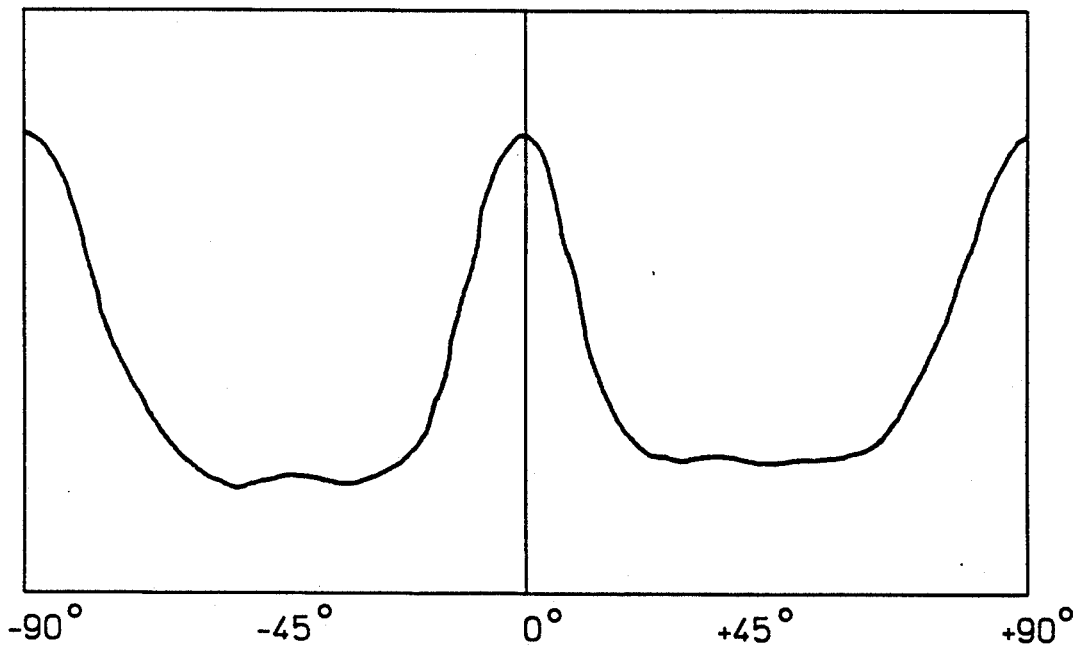
FIG. 8 is an angular power function extracted from the power spectrum of FIG. 6.

It should be noted that the angular power functions of FIGS. 7 and 8 repeat. That is, each angular power function is a singular circuit of a circular function.

In one embodiment in which a figure of merit is desired for fabricating a Manhattan layout, the figure of merit is defined as the difference between (1) the product of the value at the zero angle and the value at $+90°$ or $-90°$ and (2) the product of the calculated power values at $+45°$ and $-45°$. While not preferred, less exact calculations for extracting a figure of merit from the angular power functions may be employed. The use of the values at $+45°$ and $-45°$ can be substituted for values at angles that are not directly between the orthogonal axes. In practice, the entire method is performed electronically, using the CD tool 14 and the DSP 18 of FIG. 2A.

The above-described calculation of the figure of merit assumes that the desired features in a pattern all consist of orthogonal line sets and that any intermediate values are caused by inadequacies in the reproduction process. As previously noted, the method is extendible to other geometries, as long as all of the features of importance belong to some reasonably small set of rotational angles. For example, a non-Manhattan pattern may have line sets that are defined by a 45° index, rather than the 90° index of a Manhattan pattern. The non-Manhattan pattern would have four axes of maximum power at 45° to each other. The figure of merit would then require calculations to look at values on the extracted angular power functions other than the values at $\pm 90°$ and $\pm 45°$, since the values at $\pm 90°$ and $\pm 45°$ would all be values representative of axes of maximum optical power. For example, the formula for the non-Manhattan pattern could be a calculation of the difference between the product of values at $\pm 90°$ and the product of values at $\pm 22.5°$ on an angular power function.

Figure 12:
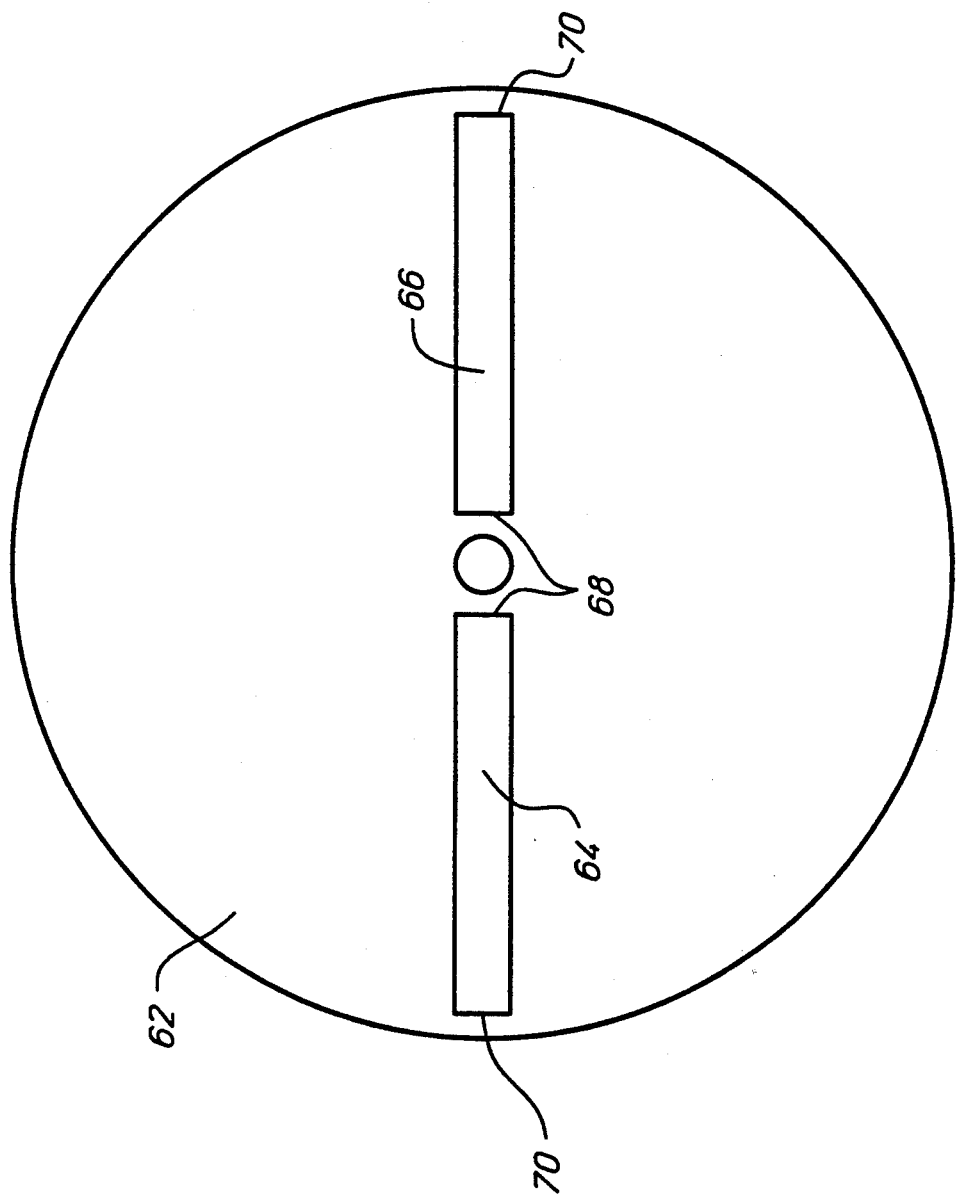
FIG. 12 is a front view of a slot shutter mechanically defining lines along which optical power is to be measured to obtain an angular power function as in FIGS. 7-8.
Figure 13:
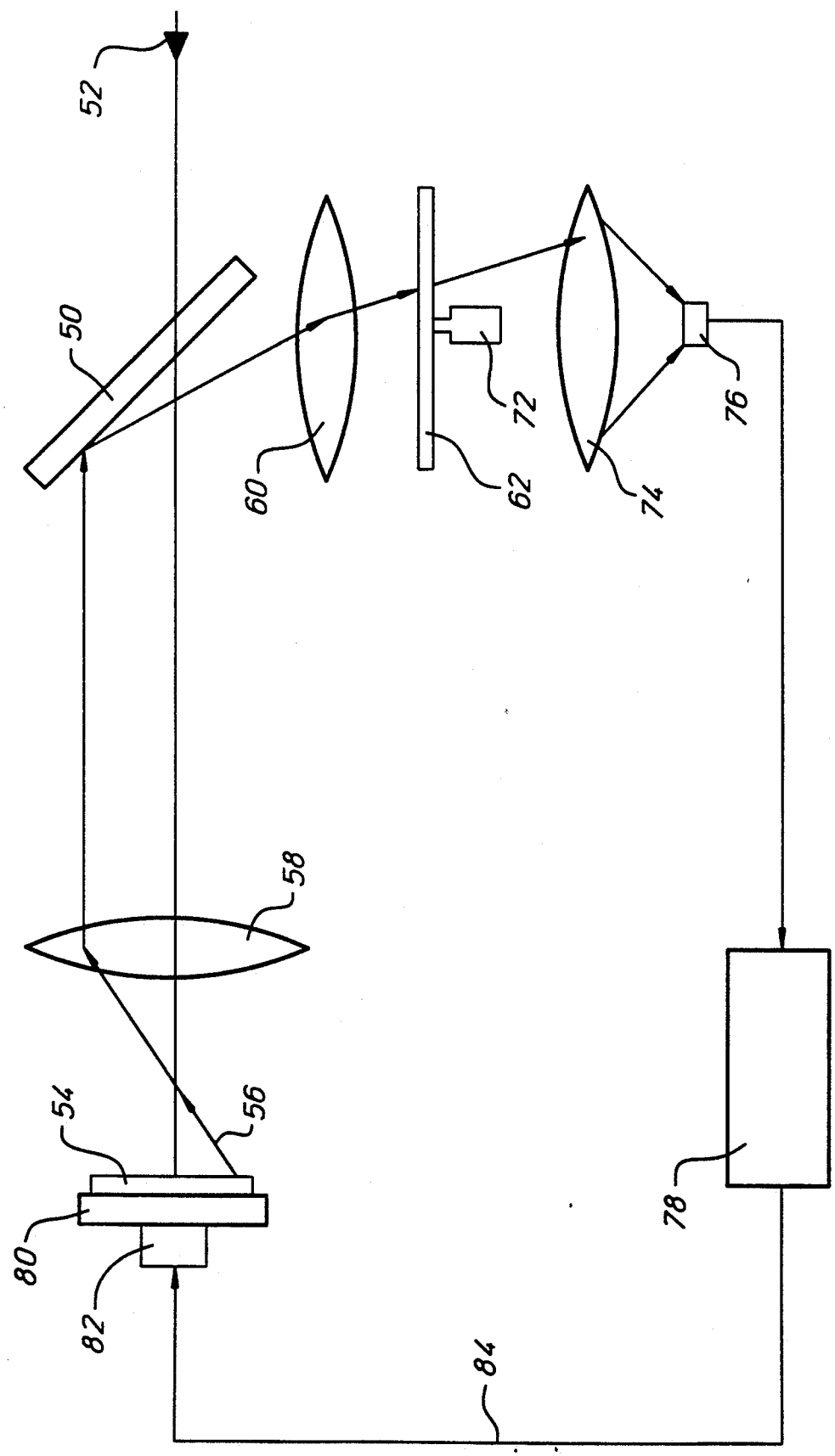
FIG. 13 is a schematic of a system that includes the slot shutter of FIG. 12 for obtaining the angular power function opto-mechanically.

Referring now to FIGS. 12 and 13, the Fourier transforms described above can be obtained optically, while the angular power functions of FIGS. 7 and 8 are obtained opto-mechanically. A half-silvered mirror 50 allows the free passage of light directed from a side shown by arrow 52. The light strikes an object 54, such as a semiconductor wafer or a printed circuit board. Optical path 56 represents light reflected from the object 54, as by an edge of a feature on the object 54. The reflected light is redirected by an objective lens 58 to the half-silvered mirror 50.

Light striking the back of the half-silvered mirror 50 is reflected to a "Fourier transform lens" 60. The lens 60 is a conventional lens that creates the transform spectrum at its back focal plane. The combination of an inspection beam, the objective lens 58, the half-silvered mirror 50 and the Fourier transform lens 60 achieves the Fourier transform from which an angular power function can be extracted. The transformed image is directed through a rotating slot shutter 62. As best seen in FIG. 12, the slot shutter includes first and second slots 64 and 66.

As noted above, the angular power function is determined by quantifying the power along a line that extends from the origin of a Fourier power spectrum. In FIG. 12, the slots 64 and 66 define such a line. Optionally, the slot shutter 62 may have a single slot. Because the shutter rotates, the angle of the line relative to an arbitrary start position continually changes. Thus, the angular power functions of FIGS. 7 and 8 can be obtained by collecting and quantifying light that shines through the shutter 62. Inner edges 68 and outer edges 70 of the slots determine minimum and maximum radii for quantifying the optical power. As previously noted, the setting of minimum and maximum radii will affect the signal-to-noise ratio.

As shown in FIG. 13, the slot shutter 62 is rotated by a motor 72. Light that passes through a slot in the shutter is redirected by an integrating lens 74 that directs the light to a photodiode 76. The photodiode generates a signal that corresponds to the intensity of collected light. The signal is then received at a digital signal processor 78. The digital signal processor performs the calculations for extracting a figure of merit from the angular power function.

The system of FIG. 13 may be employed as an on-line fabrication adjustment. That is, the system can be used to provide an automatic focus to a lithographic system. The object 54 is shown as being mounted to a Z-axis stage 80. The object 54 can be moved closer to or further from the source of incoming light 52 by means of a Z-axis motor 82. The digital signal processor 78 can be programmed in a manner to activate the Z-axis motor 82, if the figure of merit that is calculated for a pattern on the object 54 is not within an acceptable range. The signal to control the Z-axis motor 82 is transmitted from the digital signal processor 78 along control line 84.

EXPERIMENTAL RESULTS

Figure 9:
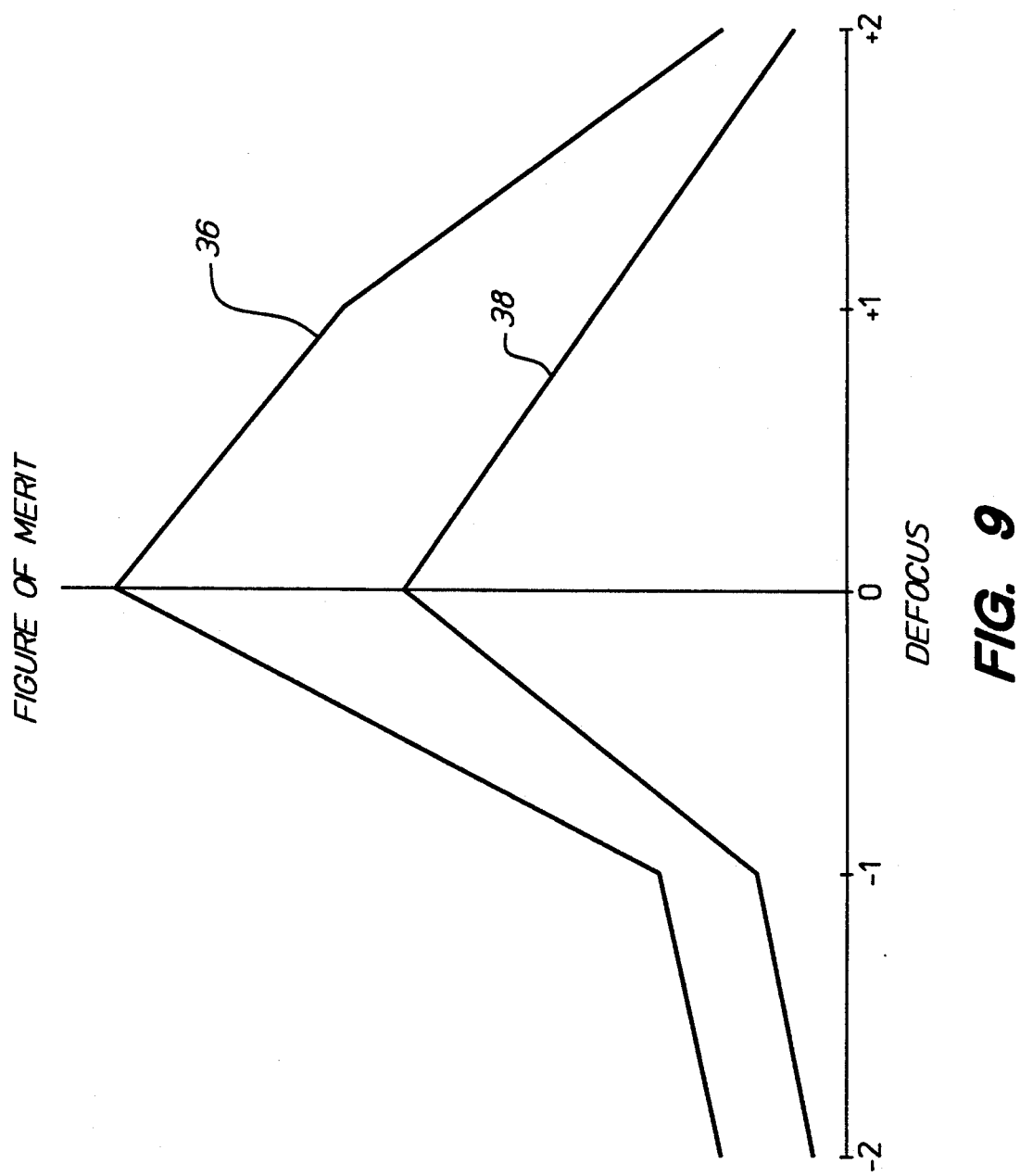
FIGS. 9-11 are plots of figure of merit versus defocus calculated for various angular power functions and for different spatial frequencies.

To test the sensitivity of the method to defocus, without introducing the complexities of a lithographic process and the complexities of SEM inspection, a test pattern was drawn and captured into the digital signal processor 18 of FIG. 2A using the CCD camera 16. Five pictures of the test pattern at various focal settings were used. Subsequent processing of the resulting images in order to extract a figure of merit yielded the plots shown in FIG. 9. A first pattern 36 is shown for a plot of figures of merit obtained without the use of a filter. A second pattern 38 was obtained using a simple edge extraction filter. It should be noted that the filter significantly enhances the sensitivity to optimum focus. The ordinate in the plot is the figure of merit, which has an arbitrary absolute value. The zero of the figure of merit is found at the intercept with the abscissa. This zero is the point at which the 90° and 45° averaged power values are equivalent.

To test the method in the realistic lithography application, a through focus series of lithographic exposures was performed in a resist and developed in the conventional manner. The focus settings ranged from $-1.4$ $\mu$m to $+1.4$ $\mu$m. An SEM was used to generate a top view image of each of the exposures in the focus series. The photolithographically printed pattern of features comprised rectangular regions, so that unlike the square feature described above, the pattern had a dominant line set.

Figure 10:
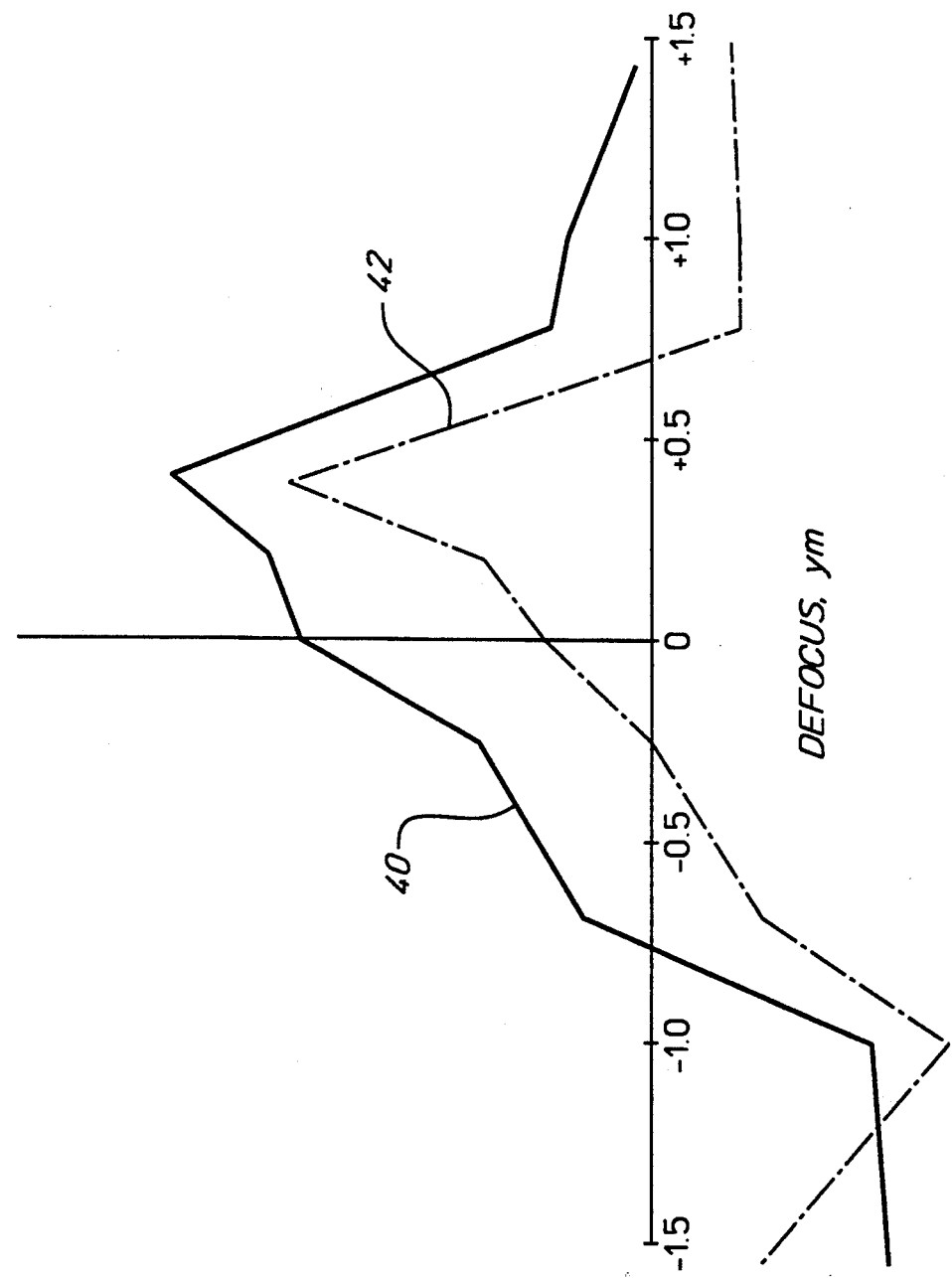
Figure 11:
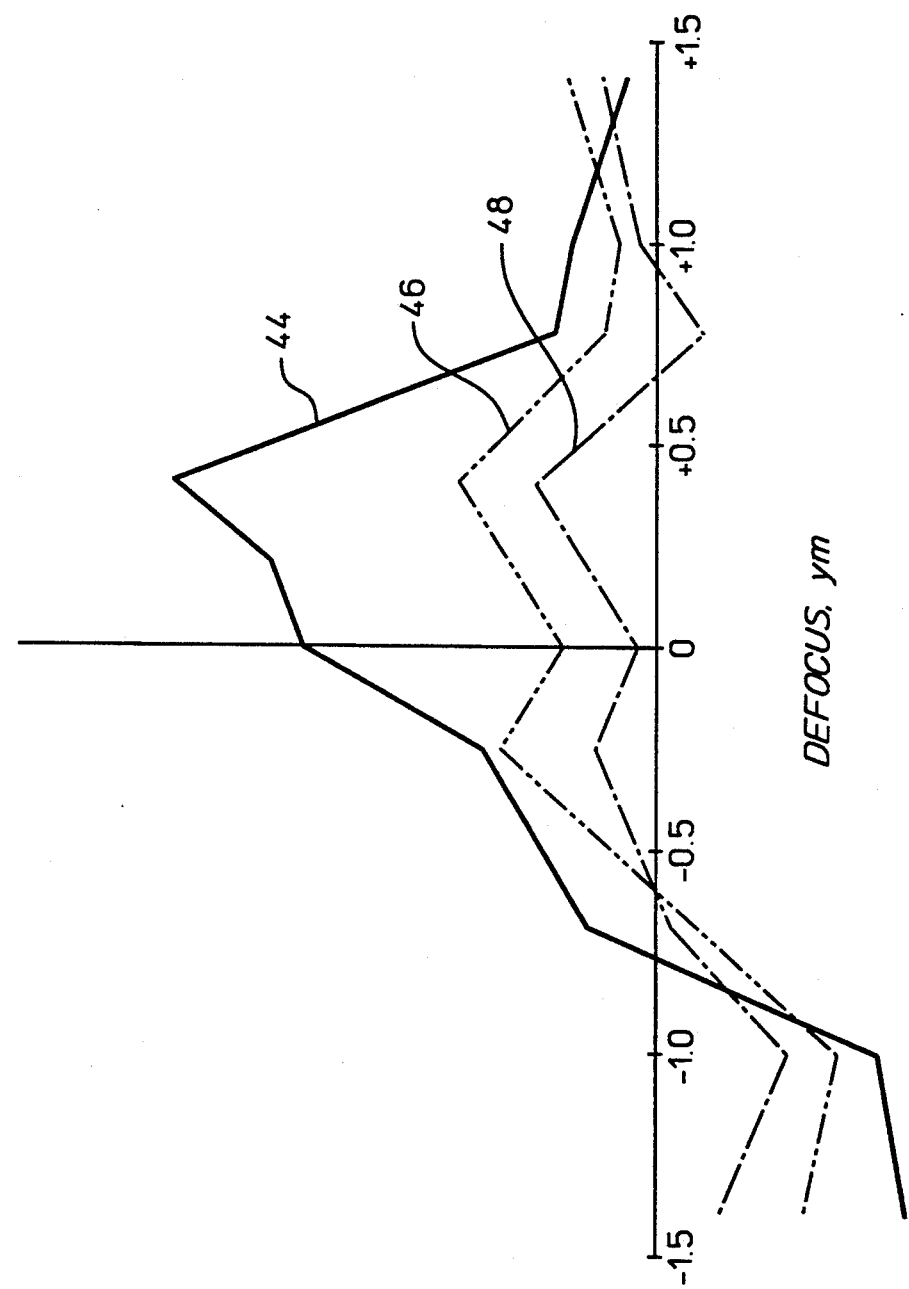

FIGS. 10 and 11 illustrate graphs of the figure of merit versus defocus, with a number of variations. In FIG. 10, a first trace 40 was obtained without the use of a filter, while the second trace 42 was obtained using image edge detection. FIG. 11 illustrates the difference in plots for variations in the minimum radius and the maximum radius defined in calculating the angular power function, i.e., the calculations were performed using different spatial frequency ranges.

Some explanation of spatial frequency as defined herein may be instructive. For each Fourier power spectrum that is determined within the through focus series of lithographic exposures, the maximum coordinates for both the abscissa and ordinate represent a spatial frequency of one pixel in dimension. This is given by the coordinate value 255, since a Fourier transform of a 512×512 array has full scale values of +255 and −255. Because the coordinate system is a spatial frequency, it is inversely proportional to the spatial dimension. For example, coordinate 128 is two pixels spatial dimension, or frequency 128/256=0.5, and 64 is four pixels or frequency 0.25. The data in FIG. 11 represent image analysis in three frequency ranges. Plot 44 has the coordinate values 10–40, with the corresponding spatial periods of 25.6–6.4 pixels. Plot 46 has the coordinate values 40–70 and the spatial periods of 6.4–3.66 pixels, while plot 48 has the coordinate values 70–100 and the spatial periods of 3.66–2.56 pixels.

From the information content of FIG. 11, it can be seen that the signal-to-noise ratio falls off rapidly as spatial frequency increases. Nyquist sampling theory would confirm that there is no information above frequency 128, corresponding to a spatial period of two pixels.

Returning to FIG. 10, a spatial frequency range of 10–60, corresponding to a spatial period of 25.6–4.3 pixels, was used in obtaining the angular power functions from which the traces were extracted. The figure illustrates the effect of using a simple edge detection algorithm on the images before beginning the Fourier processing. The edge detection does not significantly enhance the sensitivity to gross defocus in the lithographic process, but provides superior sensitivity to small defocus settings.

The optimum focus of $+0.4$ $\mu$m indicated in FIGS. 10 and 11 corresponds to the best expert interpretation of the images obtained from the through focus series. Thus, a quantitative assessment of optimal focus is obtained, leaving a method that is not overly dependent upon operator judgment.

While the steps described above are the preferred method of determining optimal settings, changes to the method are possible. For example, rather than generating a through focus series of exposures, data can be recorded for the ideal transfer of an image, whereafter the Fourier processing can take place for a single lithographic exposure for comparison to the ideal. If the single exposure is within parameters determined to be acceptable, no additional exposures or Fourier processing would be required. Thus, the method could be used for on-line quality control.

We claim:

1. A method of setting a feature-forming variant for fabricating a pattern on a substrate comprising:
   forming a pattern on a substrate,
   forming an image of the pattern,
   transforming the image according to spatial frequency of light intensity, thereby forming a transformed optical power spectrum of the image,
   determining axes of maximum power along the transformed optical power spectrum,
   comparing optical power along at least one of the axes of maximum optical power to optical power between the axes of maximum power, and
   selecting a setting for a feature-forming variant in response to the comparing of optical power.

2. The method of claim 1 wherein transforming the image is a step that includes forming a two-dimensional Fourier power spectrum.

3. The method of claim 1 wherein determining the axes of maximum power and comparing optical power include extracting an angular power function from the transformed optical power spectrum.

4. The method of claim 3 wherein extracting the angular power function includes quantifying optical power along lines extending at varying angles through an origin of the transformed optical power function, the origin being at the intersection of the axes of maximum power.

5. The method of claim 4 wherein comparing optical power further includes quantifying a difference between optical power along a line extending through the origin coincident with an axis of maximum power and along a line extending through the origin in spaced relation to each of the axes of maximum power.

6. The method of claim 1 wherein forming the pattern is one formation of a series of lithographic formations of the pattern, wherein each formation within the series differs with respect to a setting of the feature-forming variant.

7. The method of claim 4 wherein transforming the image according to spatial frequency is a step of optically forming the optical power spectrum and wherein quantifying the optical power along lines includes mechanically rotating a means for defining a line extending through the origin of the angular power function extracted from the optical power spectrum.

8. The method of claim 6 wherein the feature-forming variant is a parameter of an image projection system.

9. The method of claim 6 wherein the feature-forming variant is a variant of a resist patterning process.

10. A method of determining an optimum for one of a focus and an exposure of a system of interest comprising, forming a series of exposures for a system of interest, each exposure differing with respect to at least one of focus and exposure, for each exposure, forming a Fourier power spectrum having axes of maximum optical power, each Fourier power spectrum having an origin, from each Fourier power spectrum, extracting an angular power function, including quantifying power along at least portions of lines originating at various angles from the origin of the Fourier power spectrum, the lines including first lines that are coincident with the axes of maximum optical power and including second lines at angles to the axes of maximum optical power, for each angular power function, data in comparing power along the first lines to power along the second lines, including determining a figure of merit based upon the comparing of power, selecting a preferred exposure of the series of exposures based upon comparing the figures of merit, and selecting a setting for the system of interest based upon the setting for the system during the forming of the preferred exposure of the series of exposures.

11. The method of claim 10 wherein the origin angular power function is the point of intersection of the axes of maximum optical power.

12. The method of claim 10 wherein quantifying power along the first and second lines includes selecting minimum and maximum radii from the origin and includes quantifying power for the portion of each line between the selected radii.

13. The method of claim 10 wherein determining the figure of merit includes comparing (1) a product of quantified power of two adjacent first lines and (2) a product of quantified power of two second lines equidistant from one of the two adjacent first lines.

14. An apparatus for use in determining an optimum of a feature-forming variant of fabricating a pattern on a substrate comprising, means for fabricating a pattern on a substrate, means for receiving an image of the pattern, transforming means for providing a two-dimensional Fourier power spectrum of the image, the Fourier power spectrum having axes of maximum power which intersect at an origin, means for extracting an angular power function from the Fourier power spectrum, including memory for retaining power values for lines extending at varying angles from said origin of said Fourier power spectrum, and means for determining an optimum feature-forming variant of said means for fabricating in response to a comparison of the power values.

15. The apparatus of claim 14 wherein the means for determining an optimum includes computer circuitry for comparing a difference between maximum power values and minimum power values.

16. The apparatus of claim 14 wherein the means for fabricating is a lithographic system.

17. The apparatus of claim 14 wherein the transforming means is an electronic device.

18. The apparatus of claim 14 wherein the transforming means is a lens positioned to convert said image so as to provide a Fourier power spectrum at a back focal plane of said lens.

19. The apparatus of claim 14 wherein the means for extracting an angular power function is electronic circuitry of a digital signal processor.

20. The apparatus of claim 14 wherein the means for extracting an angular power function includes a rotating shutter having a slot for defining a line from said origin of the Fourier power spectrum.

* * * * *